(12) United States Patent
Han et al.

(10) Patent No.: US 11,818,891 B2
(45) Date of Patent: *Nov. 14, 2023

(54) MEMORY DEVICE AND FABRICATION METHOD THEREOF

(71) Applicant: Yangtze Memory Technologies Co., Ltd., Wuhan (CN)

(72) Inventors: Kai Han, Wuhan (CN); Yali Guo, Wuhan (CN); Zhipeng Wu, Wuhan (CN); Lu Zhang, Wuhan (CN); Hang Yin, Wuhan (CN); Simin Liu, Wuhan (CN); Bo Xu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/836,355

(22) Filed: Jun. 9, 2022

(65) Prior Publication Data

US 2022/0302167 A1     Sep. 22, 2022

Related U.S. Application Data

(63) Continuation of application No. 17/013,044, filed on Sep. 4, 2020, now Pat. No. 11,404,438, which is a
(Continued)

(51) Int. Cl.
*H01L 29/06*     (2006.01)
*H10B 43/27*     (2023.01)
(Continued)

(52) U.S. Cl.
CPC ......... *H10B 43/27* (2023.02); *H01L 29/0649* (2013.01); *H10B 41/10* (2023.02);
(Continued)

(58) Field of Classification Search
CPC ...... H10B 43/27; H10B 41/27; H01L 29/0649
(Continued)

(56) References Cited

U.S. PATENT DOCUMENTS 11,114,459 B2    9/2021   Iwai et al.
11,139,237 B2   10/2021   Shao et al.
(Continued)

FOREIGN PATENT DOCUMENTS

CN    109716521 A    5/2019
CN    110114881 A    8/2019
(Continued)

OTHER PUBLICATIONS

The World Intellectual Property Organization (WIPO) International Search Report for PCT/CN2020/108367 dated May 17, 2021 4 pages.

*Primary Examiner* — Monica D Harrison
(74) *Attorney, Agent, or Firm* — ANOVA LAW GROUP, PLLC

(57) ABSTRACT

A memory device includes a staircase region and an array region, along a first lateral direction; a wall structure in the staircase region; and a first separation structure in the array region and arranged along the first lateral direction with the wall structure. The wall structure includes dielectric pairs of a first dielectric layer and a second dielectric layer stacked in the staircase region. The first separation structure is vertically through a stack structure in the array region. The stack structure includes pairs of the first dielectric layer and an electrode layer.

20 Claims, 12 Drawing Sheets

Related U.S. Application Data continuation of application No. PCT/CN2020/108367, filed on Aug. 11, 2020.

(51) Int. Cl.
| | |
|---|---|
| *H10B 41/10* | (2023.01) |
| *H10B 41/27* | (2023.01) |
| *H10B 41/35* | (2023.01) |
| *H10B 43/10* | (2023.01) |
| *H10B 43/35* | (2023.01) |

(52) U.S. Cl.
CPC .............. *H10B 41/27* (2023.02); *H10B 41/35* (2023.02); *H10B 43/10* (2023.02); *H10B 43/35* (2023.02)

(58) Field of Classification Search
USPC ......................................................... 257/314
See application file for complete search history.

(56) References Cited

U.S. PATENT DOCUMENTS

| | | |
|---|---|---|
| 11,404,438 B2 * | 8/2022 | Han ........................ H10B 43/10 |
| 2013/0049096 A1 | 2/2013 | Wang |
| 2018/0061701 A1 | 3/2018 | Miyano |

FOREIGN PATENT DOCUMENTS

| | | |
|---|---|---|
| TW | I697105 B | 6/2020 |
| TW | I698004 B | 7/2020 |
| TW | I700815 B | 8/2020 |

* cited by examiner

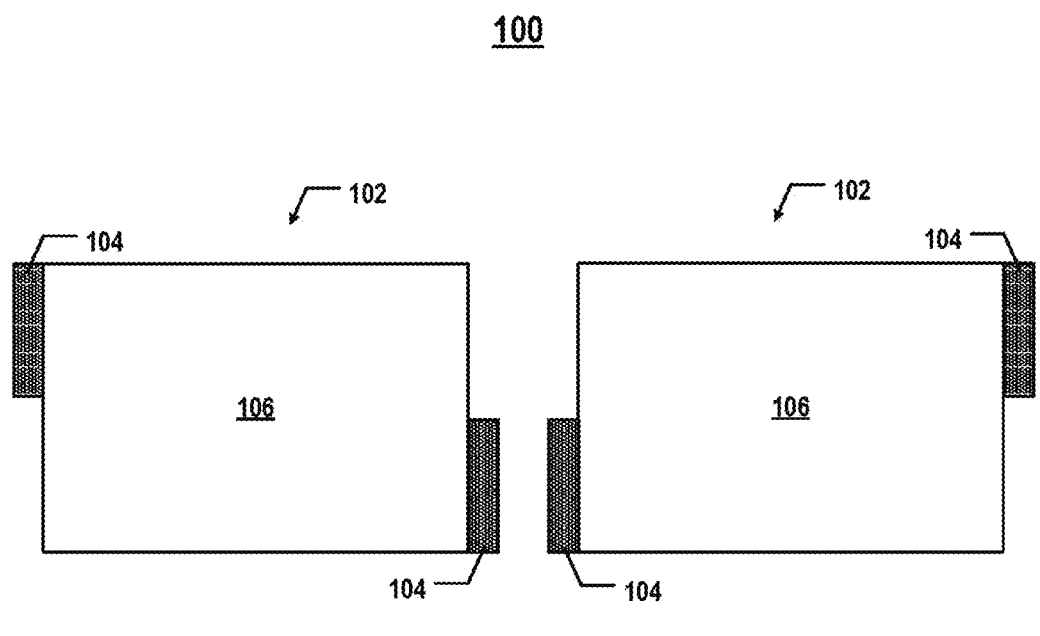
FIG. 1

| Forming a stack structure, including a plurality of first dielectric layers and a plurality of second dielectric layers that are alternately arranged over a substrate; in a first lateral direction with respect to the substrate, the stack structure including a staircase region and two memory-array regions separated by the staircase region; and in a second lateral direction with respect to the substrate, the stack structure being divided into a plurality of blocks, each including multiple fingers and a wall-structure region; the plurality of blocks including adjacent blocks having the wall-structure regions connected with each other along the second lateral direction | S601 |

| Forming a plurality of dummy channel structures in the staircase region through the stack structure; forming an isolation structure through the stack structure on each side of the staircase region between adjacent blocks having the wall-structure regions connected with each other; forming a plurality of channel structures in the two memory-array regions through the stack structure; and forming a staircase structure in each block from the stack structure in the staircase region of the multiple fingers | S602 |

| Forming a plurality of parallel gate line slits (GLSs) through the stack structure and at the boundaries of each finger and each wall-structure region of the multiple blocks, each GLS formed between adjacent blocks that have the wall-structure regions connected with each other being discontinued in the staircase region by two isolation structures | S603 |

| Removing the plurality of second dielectric layers from the memory-array regions and the staircase structure of each block; after the removal, a portion of each second dielectric layer remaining in the staircase region across adjacent blocks that have the wall-structure regions connected with each other | S604 |

| Forming a plurality of electrode layers in the empty spaces between adjacent first dielectric layers | S605 |

FIG. 15

MEMORY DEVICE AND FABRICATION METHOD THEREOF

CROSS-REFERENCE TO RELATED APPLICATION

This application is a continuation of U.S. patent application Ser. No. 17/013,044, filed on Sep. 4, 2020, which is a continuation of International Application No. PCT/CN2020/108367, filed on Aug. 11, 2020, the entire content of which is incorporated herein by reference.

FIELD OF THE DISCLOSURE

The present disclosure generally relates to the field of semiconductor fabrication technology and, more particularly, relates to a memory device and fabrication method thereof.

BACKGROUND

The production process of semiconductor electronic has made great progress with the development of the planar flash memory. However, in recent years, the continuous development of the planar flash memory encountered a number of challenges, such as physical limits, existing lithography limits, storage electron density limits, etc. In this context, in order to solve the difficulties encountered by the planar flash memory and pursue lower production cost per storage unit, various three-dimensional (3D) flash memory structures, including 3D not-or (NOR) and 3D not-and (NAND), have emerged.

In the 3D flash memory of the NOR type structure, the storage units are arranged in parallel between the bit line and the ground line, while in the 3D flash memory of the NAND type structure, the storage units are arranged in series between the bit line and the ground line. An NAND flash memory with a tandem structure has a lower read speed, but has a higher write speed and erase speed. Therefore, the NAND flash memory is suitable for storing data. In addition, the NAND flash memory also demonstrates many advantages, such as small unit size and large storage capacity, for data storage.

A 3D NAND flash memory includes a plurality of memory array structures with each memory array structure including a plurality of memory cells that are arranged in a 3D array. The 3D NAND flash memory further includes a plurality of staircase structures for making electrical connections to the memory cells at different levels. In many designs, each staircase structure corresponds to one memory array structure and is located on one side of the memory array structure. The electrical connections from the staircase structure all extend to a same direction to connect the memory array structure. When the number of the stacking layers in the memory array structure increases, the resistance of the connection lines from the staircase structure to the memory array structure increases, causing a resistive-capacitive (RC) delay problem. Therefore, the performance of the 3D NAND flash memory may be undesired.

To reduce the length of the connection lines between a staircase structure and the corresponding memory cells, in some designs, the staircase structure is disposed between two memory array structures, and the electrical connections from the staircase structure can extend in both directions to connect the memory array structures. As such, the overall resistance of the connection lines may be low, and thus the RC delay problem may be suppressed. When the staircase structure is formed between two memory array structures, some electrical connections from the staircase structure need to go through a wall structure to connect to the two memory structures. However, when the number of the stacking layers in the 3D NAND flash memory increases, the height of the wall structure may increase, and thus collapsing of the wall structure may become an issue for the 3D NAND flash memory.

The disclosed memory device and fabrication method are directed to solve one or more problems set forth above and other problems in the art.

BRIEF SUMMARY OF THE DISCLOSURE

One aspect of the present disclosure provides a memory device. The memory device includes a staircase region and an array region, along a first lateral direction; a wall structure in the staircase region; and a first separation structure in the array region and arranged along the first lateral direction with the wall structure. The wall structure includes dielectric pairs of a first dielectric layer and a second dielectric layer stacked in the staircase region. The first separation structure is vertically through a stack structure in the array region. The stack structure includes pairs of the first dielectric layer and an electrode layer.

Another aspect of the present disclosure provides a method for forming a memory device. The method includes forming dielectric pairs of a first dielectric layer and a second dielectric layer stacked in a staircase region and an array region of the memory device. The staircase region and the array region are arranged along a first lateral direction. A first separation structure is formed in the array region vertically through the dielectric pairs and extends along the first lateral direction. A portion of the second dielectric layer is removed from the array region and partially from the staircase region, thereby forming a wall structure in the staircase region. The wall structure includes a remaining portion of the second dielectric layer and the first dielectric layer stacked over one another.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 1 illustrates a schematic diagram of a 3D memory device having staircase structures at edges of memory planes;

FIG. 15 illustrates a flowchart of an exemplary method for forming a memory device according to various embodiments of the present disclosure;

DETAILED DESCRIPTION

Figure 2:
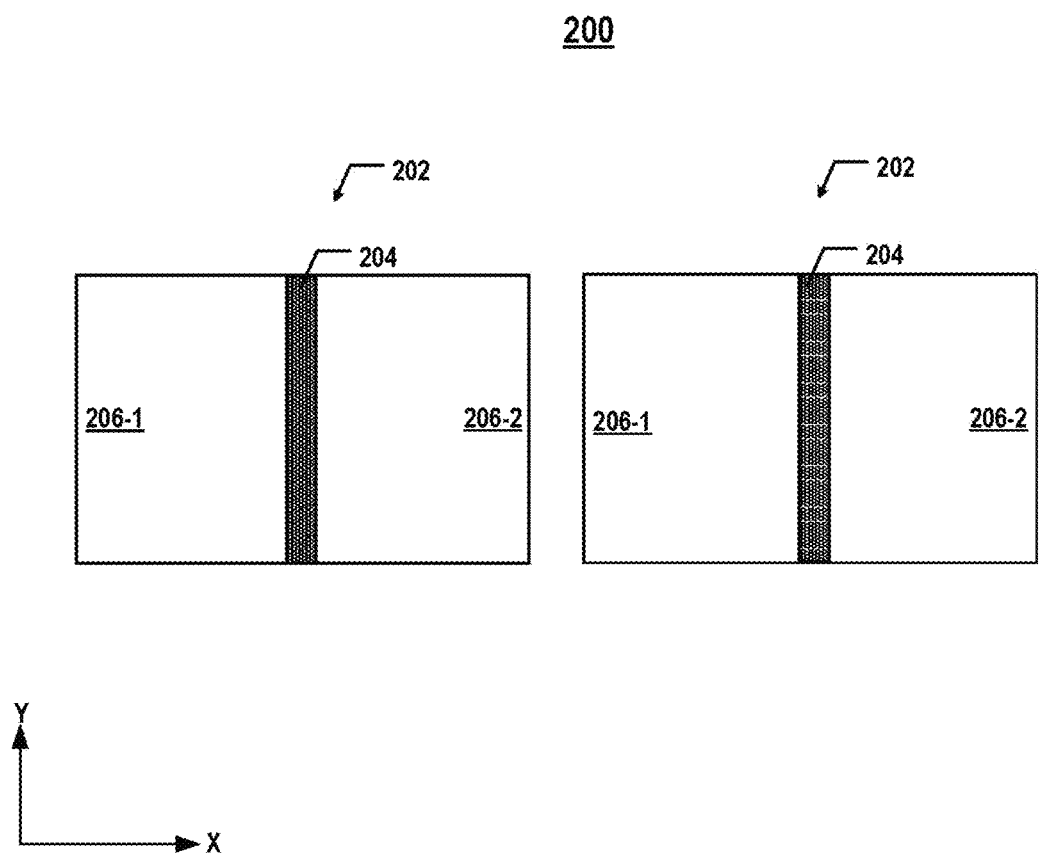
FIG. 2 illustrates a schematic diagram of another 3D memory device having staircase structures in intermediate regions of memory planes.

Reference will now be made in detail to exemplary embodiments of the invention, which are illustrated in the accompanying drawings. Wherever possible, the same reference numbers will be used throughout the drawings to refer to the same or like parts.

Although specific configurations and arrangements are discussed, it should be understood that this is done for illustrative purposes only. A person skilled in the pertinent art should recognize that other configurations and arrangements can be used without departing from the spirit and scope of the present disclosure. It will be apparent to a person skilled in the pertinent art that the present disclosure can also be employed in a variety of other applications.

It should be noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain un-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, there-above, and/or there-below. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings", such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, memory cells for storing data are vertically stacked through a stacked storage structure (e.g., a memory stack). 3D memory devices usually include staircase structures formed on one or more sides (edges) of the stacked storage structure for purposes such as word line fan-out. As staircase structures are usually formed at the edges of each memory plane, memory cells are unilaterally driven by row decoders (also known as "x-decoders") also arranged at the edges of each memory plane through the word lines and corresponding staircase structures.

FIG. 1 illustrates a schematic diagram of a 3D memory device having staircase structures at the edges of memory planes. Referring to FIG. 1, the 3D memory device 100, e.g., a 3D NAND memory device, includes two memory planes 102 each having a memory cell array in a memory array structure 106. It is noted that X and Y axes are included in FIG. 1 to illustrate two orthogonal (perpendicular) directions in the wafer plane. The X-direction is the word line direction of the 3D memory device 100, and the Y-direction is the bit line direction of the 3D memory device 100. The 3D memory device 100 also includes two staircase structures 104 at opposite sides in the X-direction of each memory array structure 106. Each word line of the memory plane 102 extends laterally in the X-direction across the entire memory plane 102 to a respective stair (level) in the staircase structure 104. A row decoder (not shown) is formed right above, below, or in proximity to a respective staircase structure 104 to reduce the interconnect length. That is, each row decoder unilaterally (either in the positive or negative X-direction, but not both) drives one-half of the memory cells through one-half of the word lines, each of which crosses the entire memory plane 102.

The load of the unilateral row word line-driving scheme thus includes the resistance of the entire word line across the memory plane 102. Moreover, as the demand for higher storage capacity continues to increase, the number of vertical levels of the stacked storage structure increases, and the thickness of the stack layers, including each word line film, decreases. Thus, high resistance may be introduced into the load, thereby causing a significant resistive-capacitive (RC) delay. Accordingly, the performance of the 3D memory device 100, such as the read and write speed, may be affected by the unilateral word line-driving scheme with side staircase structures 104.

To reduce the RC delay, in some other 3D memory devices, staircase structures are disposed between memory planes to enable a bilateral word line-driving scheme. By replacing the conventional side staircase structures with, for example, center staircase structures, each row decoder may bilaterally drive word lines in opposite directions from the middle of the memory plane, such that the resistance in the load may be reduced as the length of the word line to be driven by the row decoder decreases, for example, to one half. In some 3D memory devices, a wall structure is introduced as part of the staircase structures to connect the word line separated by the center/intermediate staircase structure. In addition, a multi-division staircase structure, in which each stair of the staircase structure includes multiple divisions for fan-out multiple word lines, is used to increase the utilization of the staircase structure and reduce the fabrication complexity. Moreover, multiple chopping processes are used to form multiple staircases at different depths to reduce the number of trim-etch processes, thereby further reducing the fabrication complexity and increasing the yield. Further, the divisions are formed after the formation of the staircases to reduce the number of material layer pairs (e.g., silicon nitride and silicon oxide pairs) in the stack structure to be etched, thereby reducing the thickness requirement for the hard mask covering areas outside of the staircases zones (e.g., the wall structures).

FIG. 2 illustrates a schematic diagram of another 3D memory device having staircase structures in the intermediate regions of memory planes. Referring to FIG. 2, a 3D memory device 200 includes two memory planes 202. Each memory plane 102 includes a memory array structure 206-1/206-2 and a staircase structure 204 in the intermediate region of the memory array structure 206-1/206-2. The staircase structure 204 laterally divides the memory array structure 206-1/206-2 into a first memory array structure 206-1 and a second memory array structure 206-2 in the X-direction (the word line direction). That is, the staircase structure 204 is formed between the first memory array structure 206-1 and the second memory array structure 206-2. Different from the 3D memory device 100 shown in FIG. 1 in which the staircase structures 104 are at opposite sides of each memory array structure 106, each staircase structure 204 in the 3D memory device 200 is located between the first memory array structure 206-1 and the second memory array structure 206-2. As shown in FIG. 2, in some examples, for each memory plane 202, the staircase structure 204 is in the middle of memory array structure 206-1/206-2. That is, the staircase structure 204 may be a center staircase structure that equally divides the memory array structure 206-1/206-2 into the first memory array structure 206-1 and the second memory array structure 206-2 with the same number of memory cells. For example, the first memory array structure 206-1 and the second memory array structure 206-2 may be symmetric in the X-direction with respect to the center staircase structure 204. It should be understood that in some other examples, the staircase structure 204 may be not in the middle (i.e. at the exact center) of the memory array structure 206-1/206-2, such that the first memory array structure 206-1 and the second memory array structure 206-2 may have different sizes and/or numbers of memory cells. In some examples, the 3D memory device 200 is a NAND Flash memory device in which memory cells are provided in the form of an array of NAND memory strings (not shown) in the first memory array structure 206-1 and the second memory array structure 206-2. The first memory array structure 206-1 and the second memory array structure 206-2 may include any other suitable components including, but not limited to, gate line slits (GLSs), through array contacts (TACs), array common sources (ACSs), etc.

Each word line (not shown) of a memory plane 202 extending laterally in the X-direction is separated by the corresponding staircase structure 204 into two parts: a first word line part across the first memory array structure 206-1, and a second word line part across the second memory array structure 206-2. As described below in detail, the two parts of each word line are electrically connected by a wall structure (not shown) in the staircase structure 204 at a respective stair in staircase structure 204. A row decoder (not shown) is formed right above, below, or in proximity to the respective staircase structure 204 to reduce the interconnect length. As a result, different from the row decoder of the 3D memory device 100 shown in FIG. 1, each row decoder of the 3D memory device 200 bilaterally (both in the positive and negative X-directions) drives the memory cells in the first memory array structure 206-1 and the second memory array structure 206-2. That is, by replacing the conventional side staircase structures (e.g., the staircase structures 104 shown in FIG. 1) with, for example, the staircase structures 204 in the intermediate of the memory array structure 206-1/206-2, each row decoder bilaterally drives the word lines in opposite directions from the intermediate of the memory plane 202, such that the resistance in the load may be reduced as the length of the part of each word line to be driven by the row decoder decreases, for example, to one half when the staircase structure 204 is disposed in the middle of the memory array structure 206-1/206-2. That is, the row decoder of the 3D memory device 200 only needs to drive either the first word line part or the second word line part of each word line.

Figure 3:
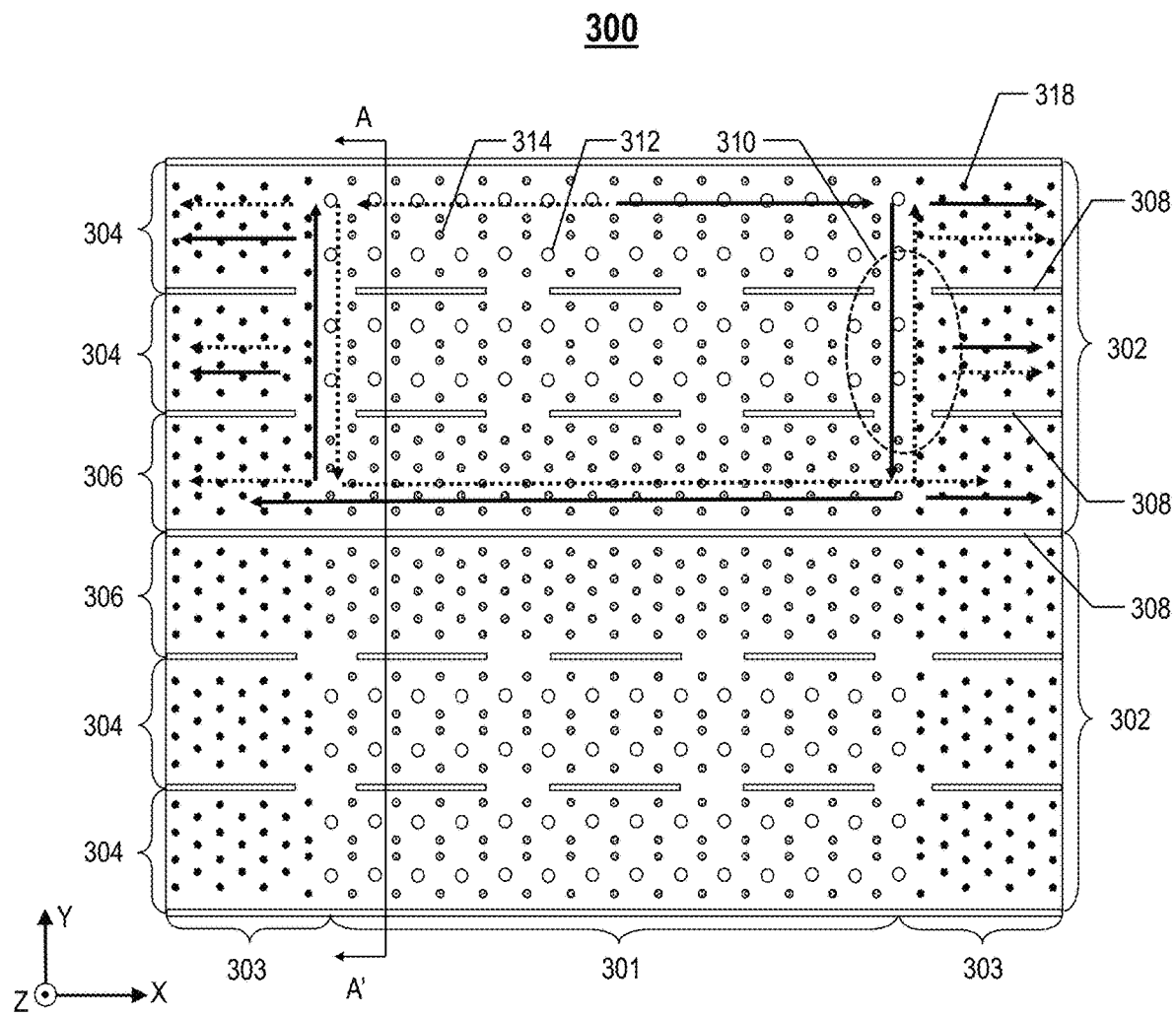
FIG. 3 illustrates a plan view of a 3D memory device having a staircase structure at a center of a memory plane.
Figure 4:
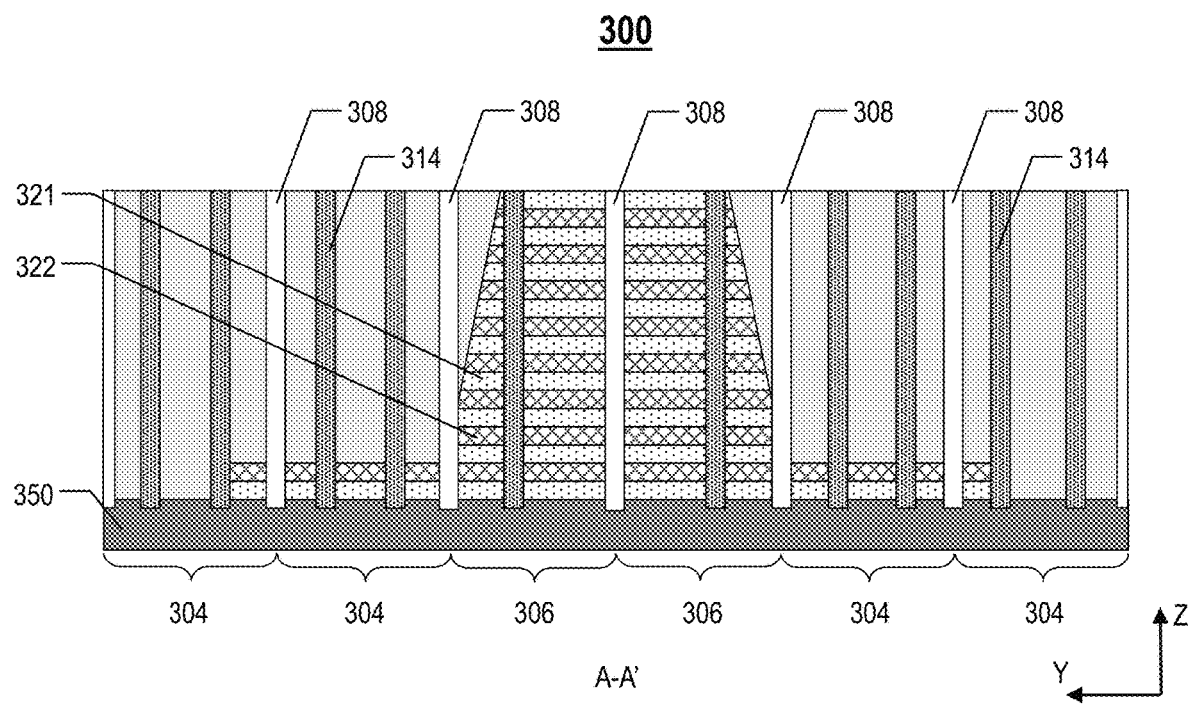
FIG. 4 illustrates a cross-sectional view of the 3D memory device shown in FIG. 3 along an A-A' direction.

FIG. 3 illustrates a plan view of a 3D memory device having a staircase structure at a center of a memory plane, and FIG. 4 illustrates a cross-sectional view of the 3D memory device shown in FIG. 3 along an A-A' direction. Referring to FIGS. 3-4, X, Y, and Z axes are used to illustrate the spatial relationship of the components in the 3D memory device 300. The 3D memory device 300 includes a substrate 350 and a stack structure, including a plurality of dielectric layers 321 and a plurality of sacrificial layers 322. The plurality of dielectric layers 321 and the plurality of sacrificial layers 322 are alternately arranged. In the X-direction, the 3D memory device 300 includes a staircase region 301 at the center of a memory plane (not shown). The 3D memory device 200 may be one example of part of memory plane 202 in FIG. 2 that includes a staircase structure 204, and the staircase region 301 of the 3D memory device 300 may be an example corresponding to the staircase structure 204 in the memory plane 202. As shown in FIG. 3, the 3D memory device 300 is divided into multiple blocks 302 in the Y-direction (the bit line direction) separated by a plurality of parallel GLSs 308. In some examples, the 3D memory device 300 is a NAND Flash memory device, and accordingly, each block 302 is the smallest erasable unit of the NAND Flash memory device. Each block 302 further includes multiple fingers 304 in the Y-direction separated by some of the GLSs 308 with "H" cuts 310. Each block 302 also includes a wall-structure region 306 separating the block 302 from an adjacent block 302.

Referring to FIG. 3, the staircase region 301 is an intermediate (e.g., the middle) region of the 3D memory device 300 in the X-direction (the word line direction). In addition, the 3D memory device 300 also includes two array regions 303 separated by the staircase region 301. A plurality of top select gates (TSGs) may be formed in the array regions 303, and the plurality of TSGs may be electrically connected to interconnects over the staircase region 301. As described below in detail, the staircase region 301 includes multiple staircase zones each corresponding to a respective finger 304 and includes multiple wall structures (not labeled) corresponding to the wall-structure regions 306. That is, each wall structure is formed in a region overlapped by the staircase regions 301 and a corresponding wall-structure region 306. Therefore, the wall structure does not extend into any array region 303 along the X-direction. The 3D memory device 300 includes a plurality of dummy channel structures 314 in the staircase region 301 including the staircase zones and the wall structures to provide mechanical support and/or load balancing. The 3D memory device 300 further includes a plurality of word line contacts 312 in the staircase zones of the staircase region 301 and each word line contact 312 is landed on a respective word line (not shown) at each stair in the staircase region 301 for word line driving. The 3D memory device 300 may also include a plurality of channel structures 318 formed in the two array regions 303.

To achieve the bilateral word line-driving scheme, each wall structure connects (both physically and electrically) a first memory array structure and a second memory array structure (not shown) that are respectively formed in the two array regions 303. In the memory device, each word line is bilaterally driven (in both positive and negative x-directions) from a respective word line contact 312 in the staircase zones of the staircase region 301 in the intermediate of the 3D memory device 300 through the wall structures. FIG. 3 further schematically illustrates the current paths of the bilateral word line-driving scheme with the wall structures. A first current path indicated by the solid-line arrows and a second current path indicated by the dashed-line arrows represent currents passing through two separate word lines at different levels, respectively.

Figure 5:
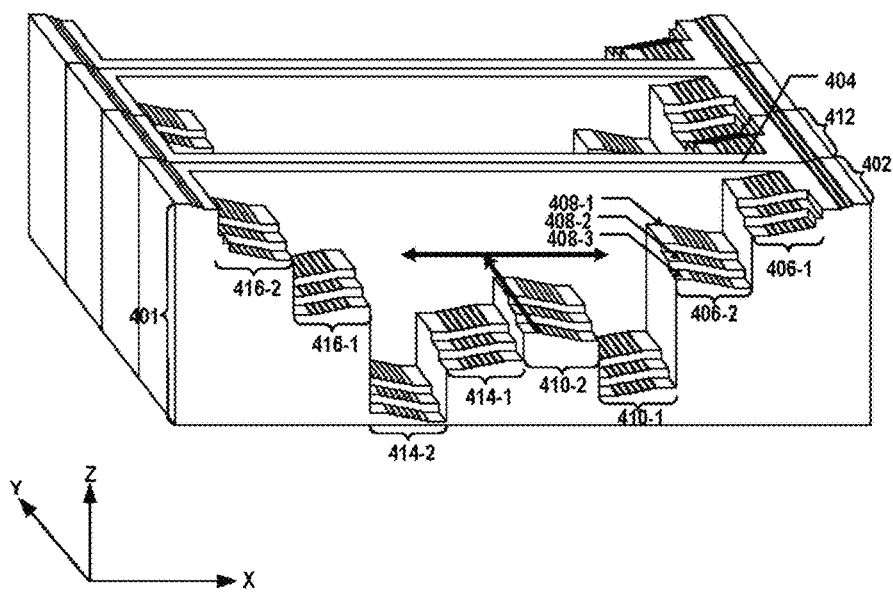
FIG. 5 illustrates a top front perspective view of a staircase structure of a 3D memory device.

FIG. 5 illustrates a top front perspective view of a staircase structure 400 of a 3D memory device. The staircase structure 400 may be one example of the staircase structure 204 of the 3D memory device 200 shown in FIG. 2 or may correspond to the staircase region 301 of the 3D memory device 300 shown in FIG. 3. The staircase structure 400 includes a stack structure 401 formed on a substrate (not shown).

In FIG. 5, X, Y, and Z axes are used to illustrate the spatial relationship of the components in the staircase structure 400. The substrate of the 3D memory device includes two lateral surfaces extending laterally in the X-Y plane: a top surface on the front side of the wafer on which the staircase structure 400 is formed, and a bottom surface on the backside opposite to the front side of the wafer. The Z-axis is perpendicular to both the X and Y axes. As used herein, whether one component (e.g., a layer or a device) is "on," "above," or "below" another component (e.g., a layer or a device) of the 3D memory device is determined relative to the substrate of the 3D memory device in the Z-direction (the vertical direction perpendicular to the X-Y plane) when the substrate is positioned in the lowest plane of the 3D memory device in the Z-direction.

The stack structure 401 includes a plurality of first material layers (not shown) and a plurality of second material layers (not shown) that are alternatively stacked in the Z-direction. The material used for forming the plurality of first material layers is different from the material used for forming the plurality of second material layers. That is, the stack structure 401 includes a plurality of material layer pairs stacked vertically in the Z-direction with each material layer pair includes a first material layer and a second material layer. The number of the material layer pairs in the stack structure 401 (e.g., 32, 64, 96, 128, 160, 192, 224, or 256) determines the number of memory cells stacked in the Z-direction.

For example, the 3D memory device is a NAND Flash memory device, and the stack structure 401 is a stacked storage structure through which NAND memory strings are formed. Each of the first material layers includes a conductive layer, and each of the second material layers includes a dielectric layer. That is, the stack structure 401 includes interleaved conductive layers and dielectric layers (not shown). Further, each conductive layer functions as a gate line of the NAND memory strings and a word line extending laterally from the gate line and ending at staircase structure 400 for word line fan-out.

Each stair (as shown as a "level") of the staircase structure 400 includes one or more material layer pairs. Referring to FIG. 5, the top material layer of each stair is a conductive layer for interconnection in the vertical direction (Z-direction), and every two adjacent stairs of the staircase structure 400 are offset by a nominally same distance in the Z-direction and a nominally same distance in the X-direction. Each offset thus forms a "landing area" for interconnection with the corresponding word line contact (not shown) of the 3D memory device in the Z-direction direction.

As shown in FIG. 5, the staircase structure 400 includes a first staircase zone 402, a second staircase zone 412, and a wall structure 404 between the first staircase zone 402 and the second staircase zone 412 in the Y-direction (the bit line direction). The first staircase zone 402 includes a plurality pairs of staircases including a first pair of staircases 406-1 and 406-2, a second pair of staircases 410-1 and 410-2, a third pair of staircases 414-1 and 414-2, and a fourth pair of staircases 416-1 and 416-2 in the X-direction (the word line direction). Each staircase (e.g., 406-1, 406-2, 410-1, 410-2, 414-1, 414-2, 416-1, or 416-2) includes a plurality of stairs in the X-direction. Moreover, each staircase is a functional staircase used for landing interconnects (e.g., word line via contacts), as opposed to a dummy staircase.

Further, the first staircase zone 402 includes three fingers in the Y-direction, and accordingly, each staircase of 406-1, 406-2, 410-1, 410-2, 414-1, 414-2, 416-1, and 416-2 includes three divisions 408-1, 408-2, and 408-3 in the Y-direction. In the staircase 406-2, each stair in the division 408-2 is below any stair in the division 408-1 and is above any stair in the division 408-3.

Further, at least one stair in the staircase in the first or second staircase zone 402 or 412 is electrically connected to each of the first memory array structure and the second memory array structure through the wall structure 404. For example, as shown in FIG. 5, a stair in the staircase 410-2 may be electrically connected to both the first memory array structure and the second memory array structure through the wall structure 404 by the respective word line parts extending in the negative and positive X-directions, respectively, as indicated by the current paths (represented by the arrows).

Referring to FIG. 5, as the number of the material layer pairs in the stack structure 401 increases, the staircase exposing the bottom material layer pair has a large depth with respect to the top of the wall structure 404. That is, the aspect ratio of the wall structure (the height in the Z-direction versus the width in the Y-direction) is large. Further, referring to FIGS. 3-4, in the process of fabricating the 3D memory device, a plurality of GLSs may be fabricated after forming the staircases. For example, referring to FIG. 3, a GLS needs to be formed all the way through the entire wall structure in the X-direction to separate adjacent staircase zones. With a large aspect ratio of the wall structure, during the formation of the GLSs, the wall structure may collapse, thereby affecting the performance of the 3D memory device.

The present disclosure provides a method for forming a memory device. FIG. 15 illustrates a flowchart of an exemplary method for forming a memory device according to various embodiments of the present disclosure, and FIGS. 6-14 illustrate schematic views of semiconductor structures at certain stages of the exemplary method.

Figure 6:
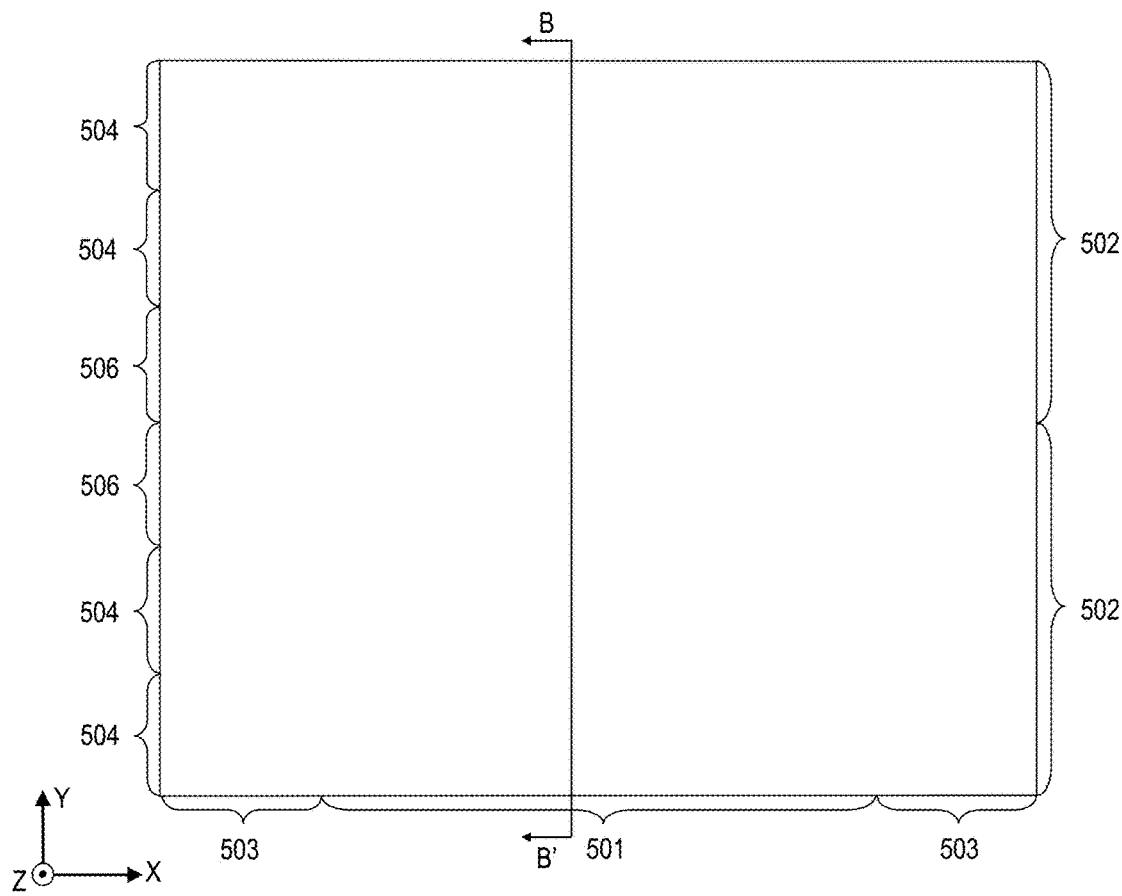
FIGS. 6-14 illustrate schematic views of semiconductor structures at certain stages of an exemplary method according to various embodiments of the present disclosure.
Figure 7:
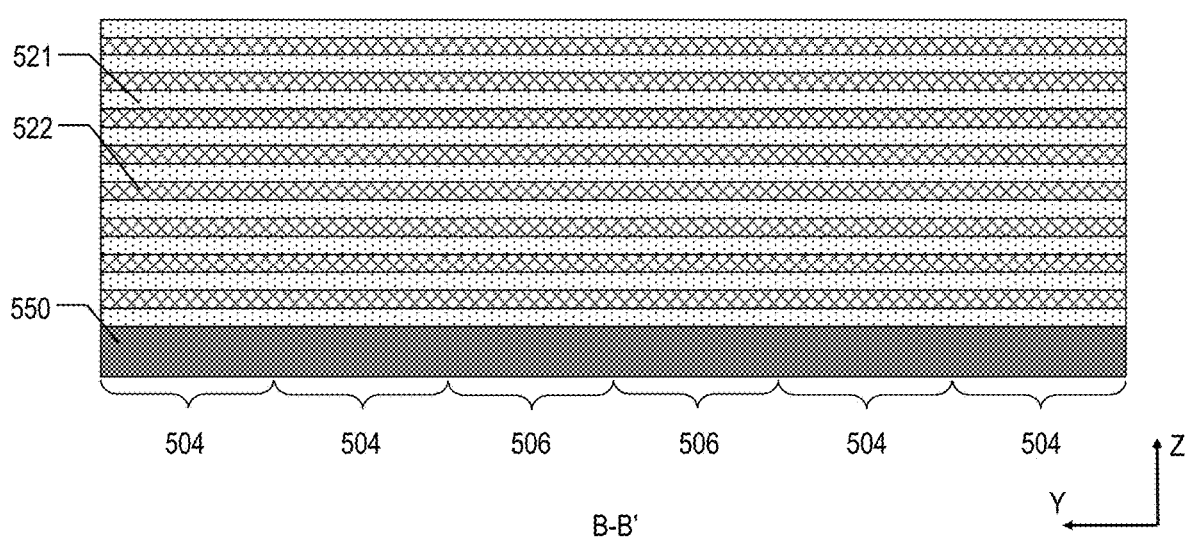

Referring to FIG. 15, a stack structure, including a plurality of first dielectric layers and a plurality of second dielectric layers that are alternately arranged over a substrate, may be formed; in a first lateral direction with respect to the substrate, the stack structure may include a staircase region and two array regions separated by the staircase region; in a second lateral direction with respect to the substrate, the stack structure may be divided into a plurality of blocks with each including multiple fingers and a wall-structure region; and the plurality of blocks may include adjacent blocks having the wall-structure regions connected with each other along the second lateral direction (S601). FIGS. 6-7 illustrate schematic views of an exemplary semiconductor structure according to various embodiments of the present disclosure. Specifically, FIG. 6 illustrates a schematic plane view of the semiconductor structure, and FIG. 7 illustrates a schematic cross-sectional view of the semiconductor structure shown in FIG. 6 along a B-B' direction.

Referring to FIGS. 6-7, a stack structure, including a plurality of first dielectric layers 521 and a plurality of second dielectric layers 522, may be formed on a substrate 550. The plurality of second dielectric layers 522 and the plurality of first dielectric layers 521 may be alternately disposed on the substrate 550. In FIGS. 6-7, X, Y, and Z axes are used to illustrate the spatial relationship of the components in the semiconductor structure. The same notion for describing the spatial relationship is applied throughout the present disclosure. In the X-direction, the stack structure may include a staircase region 501 and two array regions 503 separated by the staircase region 501. In the Y-direction, the stack structure may be divided into a plurality of blocks 502. In one embodiment, each block 502 may be used to form an erasable unit of the 3D NAND Flash memory. Further, in the Y-direction, each block 502 may include multiple fingers 504 together with a wall-structure region 506. The wall-structure region 506 may separate the multiple fingers 504 of the block 502 from an adjacent block 502. The plurality of blocks 502 may include adjacent blocks 502 that have the wall-structure regions 506 next to each other. It should be noted that, for illustrative purposes, only a part of each array region 503 that is adjacent to the staircase region 501 is shown in FIG. 6.

In subsequent fabrication processes, a staircase structure may be formed in the staircase region 501 of each block 502, and a plurality of memory cells (e.g., a memory array structure) may be formed in each array region 503. Accordingly, when the staircase structures are formed in two adjacent blocks 502, a wall structure may thus be formed in the wall-structure regions 506 between the two blocks 502. That is, the wall structure may be formed in the overlapped portion between the two wall-structure regions 506 and the staircase region 501.

In one embodiment, the substrate 550 may be made of silicon, germanium, silicon germanium, or any other appropriate semiconductor material. In other embodiments, the substrate may be made of silicon on insulator (SOI), germanium on insulator (GOI), or other appropriate semiconductor composite.

In one embodiment, the plurality of first dielectric layers 521 may be made of an oxide, e.g., silicon oxide, and the plurality of second dielectric layers 522 may be made of a nitride, e.g., silicon nitride. Therefore, the stack structure may be a nitride-oxide (NO) stack structure including a plurality of NO stacks.

Figure 8:
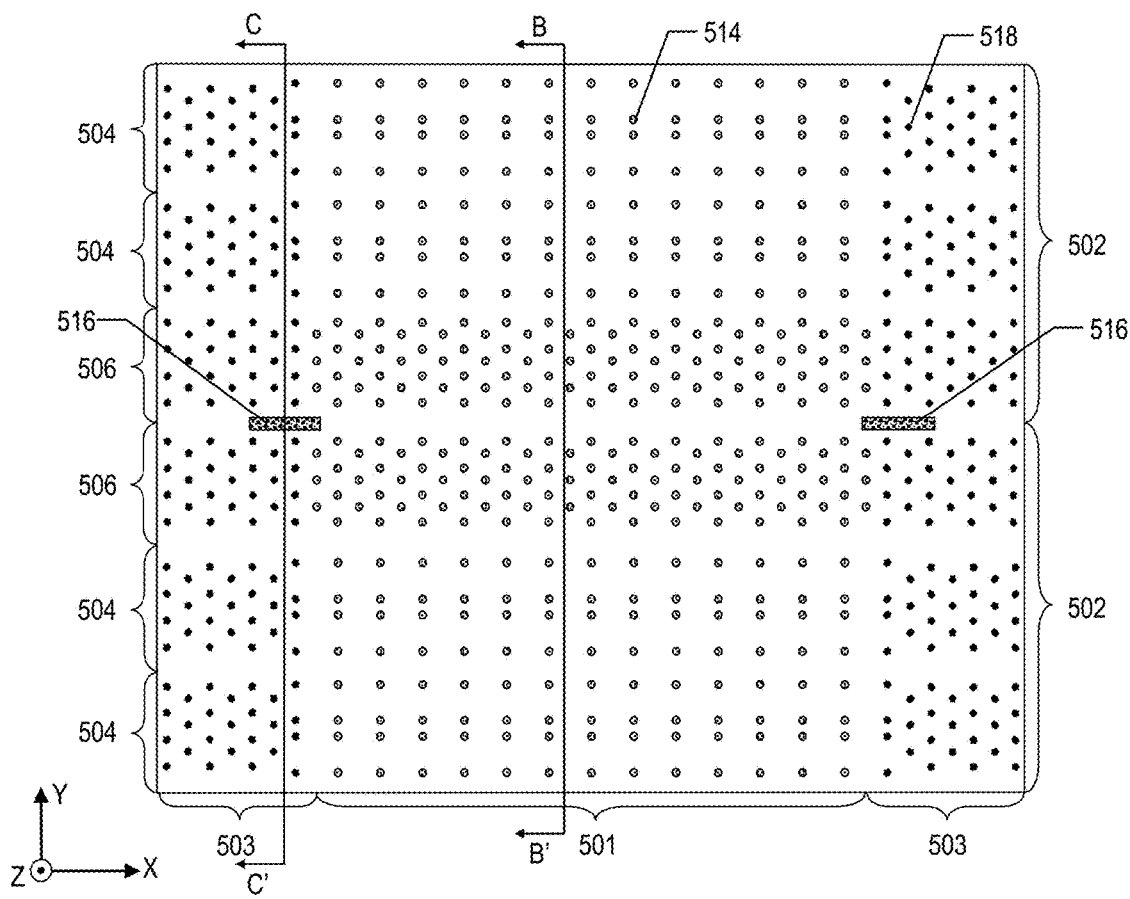
Figure 9:
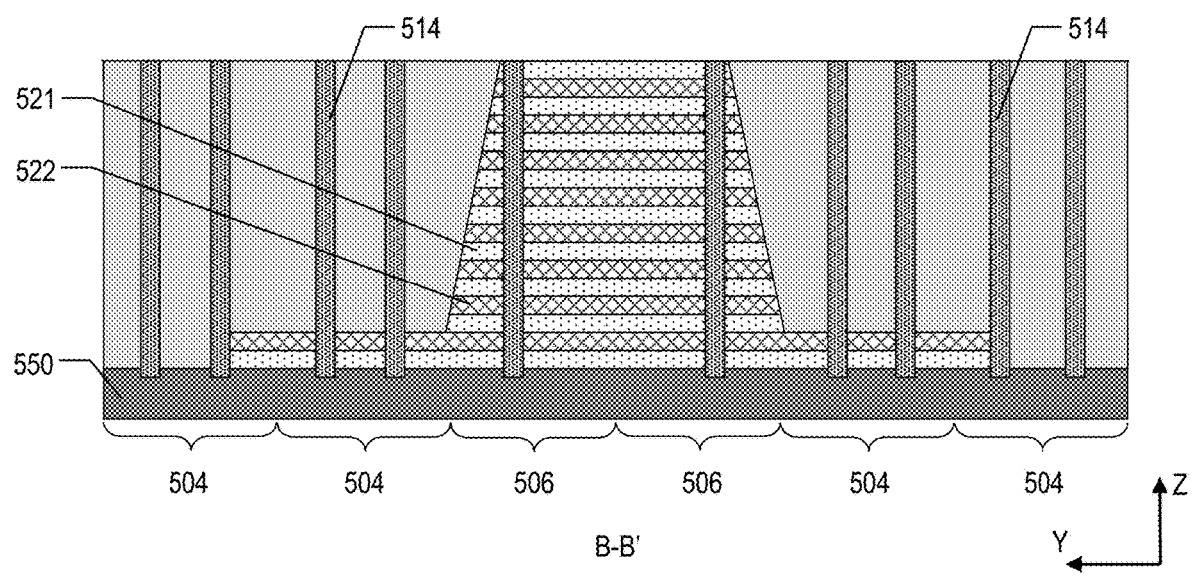
Figure 10:
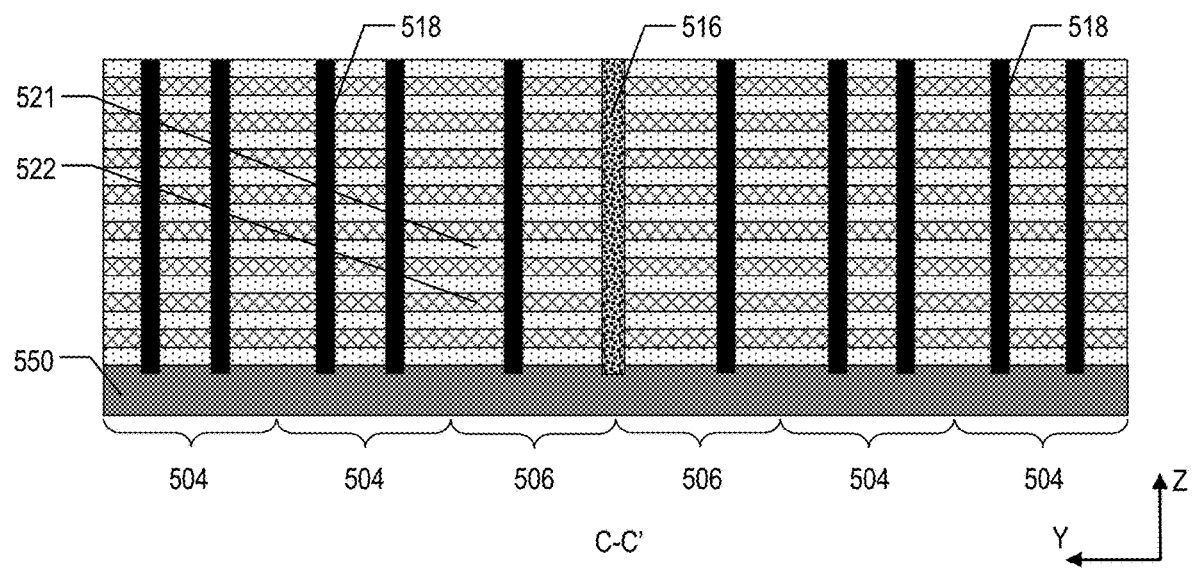

Returning to FIG. 15, a plurality of dummy channel structures may be formed in the staircase region through the stack structure; a first isolation structure may be formed through the stack structure on each side of the staircase region between adjacent blocks that have the wall-structure regions connected with each other; a plurality of channel structures may be formed in the two array regions through the stack structure; and a staircase structure may be formed in each block from the stack structure in the staircase region of the multiple fingers (S602). FIGS. 8-10 illustrate schematic views of an exemplary semiconductor structure according to various embodiments of the present disclosure. Specifically, FIG. 8 illustrates a schematic plane view of the semiconductor structure, FIG. 9 illustrates a schematic cross-sectional view of the semiconductor structure shown in FIG. 8 along a B-B' direction, and FIG. 10 illustrates a schematic cross-sectional view of the semiconductor structure shown in FIG. 8 along a C-C' direction.

Referring to FIGS. 8-10, a plurality of dummy channel structures 514 may be formed in the staircase region 501 through the stack structure. Moreover, a first isolation structure 516 may be formed through the stack structure on each side of the staircase region 501 between adjacent blocks 502 that have the wall-structure regions 506 connected with each other along the Y-direction.

The first isolation structure 516 may be used to provide protection for the center portion of the second dielectric layers 522 of the stack structure in a subsequently-formed wall structure between adjacent blocks 502, such that the center portion of the second dielectric layers 522 in the wall structure may not be removed when replacing the second dielectric layer 522 with metallic electrode layers in a subsequent process. The remaining center portion of the second dielectric layers 522 (which may be made of a nitride) together with the first dielectric layers 521 (which may be made of an oxide) in the wall structure may not only provide mechanical support for the subsequent fabrication processes, but also provide electric isolation for adjacent blocks 502.

In one embodiment, the first isolation structure 516 may have a rectangular shape. Moreover, the dimension of the first isolation structure 516 in the X-direction may be larger than a dimension of the first isolation structure 516 in the Y-direction. For example, the dimension of the first isolation structure 516 in the Y-direction may be in a range of approximately 10 nm to 40 nm. The dimension of the first isolation structure 516 in the Y-direction may not be too large, otherwise the process for filling up the corresponding opening to form the first isolation structure 516 may take more time and use more materials. The dimension of the first isolation structure 516 in the Y-direction may not be too small, otherwise the first isolation structure 516 may not be able to provide sufficient protection for the center portion of the second dielectric layers 522 in the wall structure during a subsequent etching process. Moreover, the dimension of the first isolation structure 516 in the X-direction may be larger than the half of the dimension of the wall-structure region 506 in the Y-direction. In other embodiments, the first isolation structure may have any other appropriate shape.

In one embodiment, the portion of the first isolation structure 516 formed in the array region 503 may be substantially larger than the portion of the first isolation structure 516 formed in the staircase region 501. For example, the entire first isolation structure 516 may be formed in the array region 503 with one side (e.g., edge) overlapped with the boundary between the array region 503 and the staircase region 501, or the portion of the first isolation structure 516 formed in the array region 503 may be two times larger than the portion of the first isolation structure 516 formed in the staircase region 501. In other embodiments, the portion of the first isolation structure formed in the array region may be equal to or smaller than the portion of the first isolation structure formed in the wall-structure region.

In one embodiment, the plurality of dummy channel structures 514 formed in the staircase region 501 may be used to provide mechanical support for subsequent removal of the plurality of second dielectric layers 522. That is, after removing the plurality of second dielectric layers 522, the plurality of dummy channel structures 514 may remain.

The first isolation structures 516 and the plurality of dummy channel structures 514 may be made of an insulating material. For example, the first isolation structures 516 and the plurality of dummy channel structures 514 may be made of silicon oxide. In one embodiment, the plurality of dummy channel structures 514 and the first isolation structures 516 may be formed simultaneously by a same fabrication process. Forming the plurality of dummy channel structures 514 and the first isolation structures 516 in a same fabrication process may be conducive to reducing the process complexity.

In other embodiments, the process adopted for forming the first isolation structures may be at least partially different from the process adopted for forming the plurality of dummy channel structures in the staircase region. For example, an isolation trench that is used to form the first isolation structure at each side of the staircase region 501 between adjacent blocks 502 may be formed simultaneously with a plurality of dummy channel trenches that is used to form the plurality of dummy channel structures in the staircase region, and then the isolation trenches and the plurality of dummy channel trenches may be filled in different filling processes to separately form the first isolation structures and the plurality of dummy channel structures. The material used to fill the isolation trenches may or may not be the same as the material used to fill the dummy channel trenches. It should be noted that the material used to fill the isolation trenches to form the first isolation structures 516 and the material used to fill the dummy channel trenches to form the dummy channel structures may both have a low etch rate as compared to the plurality of second dielectric layers 522 in a subsequent etching process when removing the plurality of second dielectric layers 522.

In one embodiment, a plurality of channel structures 518 may be formed in the two array regions 503 through the stack structure. For example, when forming the plurality of dummy channel trenches (not shown) in the staircase region 501 and the isolation trench (not shown) at each side of the staircase region 501 between adjacent blocks 502, a plurality of channel trenches (not shown) may be simultaneously formed in the array regions 503. Further, the plurality of channel trenches may be filled by a set of material layers to form the plurality of channel structures 518 in the array regions 503. In one embodiment, each channel structure 518 may include a blocking layer (not shown), a charge trapping layer (not shown), a tunneling layer (not shown), and a channel layer (not shown) along a direction toward the center of the channel structure 518. It should be noted that the plurality of channel structures 518 formed in the two array regions 503 may also provide mechanical support for a subsequent process of removing the plurality of nitride layers. Moreover, after forming a plurality of GLSs in a subsequent process, a portion of the blocking layer, the charge trapping layer, and the tunneling layer located at the lower end of each channel structure 518 may be removed, and a selective epitaxial growth (SEG) process may be performed to electrically connect the channel layer in each channel structure 518. As such, the plurality of channel structures 518 may serve as components of memory cells in the formed memory device. In one embodiment, filling the plurality of channel trenches to form the plurality of channel structures 518 may be performed before or after filling the isolation trenches and the plurality of dummy channel trenches to respectively form the first isolation structures 516 and the plurality of dummy channel structures 514.

Further, for each block 502, a staircase structure may be formed in each block 502 from the stack structure in the staircase region 501 of the multiple fingers 504. As such, a wall structure (not labeled) may be formed between two staircase structures of adjacent blocks 502. That is, a wall structure may be formed in the overlapped region between the staircase region 501 and the two adjacent wall-structure regions 506. Referring to FIG. 9, in the Y-direction, the wall structure may be formed across two wall-structure regions 506, which are respectively from two adjacent blocks 502. In the X-direction, the wall structure may have each end terminated at the boundary between the corresponding array region 503 and the staircase region 501. The staircase structure may be formed using any fabrication process known to those skill in the art, and the present disclosure does not specifically define the process for forming the staircase structure.

Figure 11:
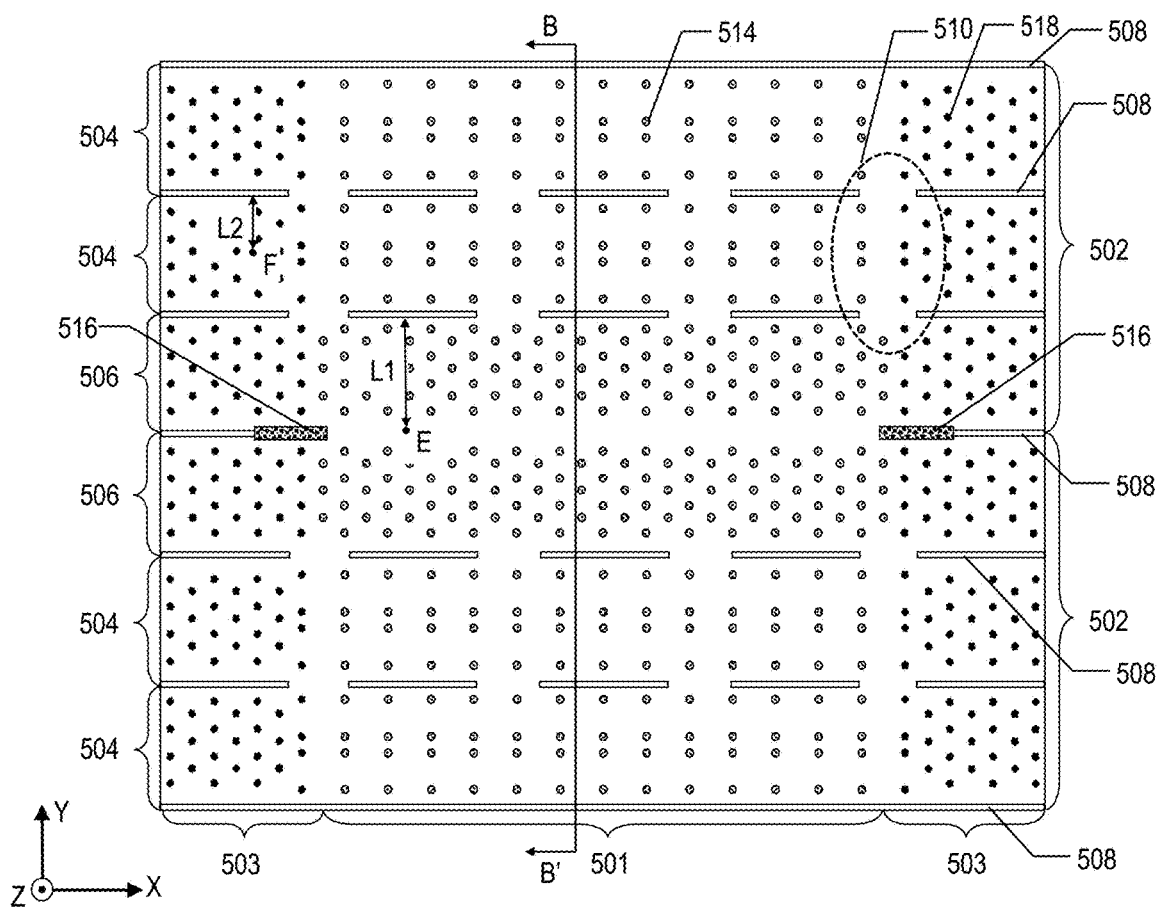
Figure 12:
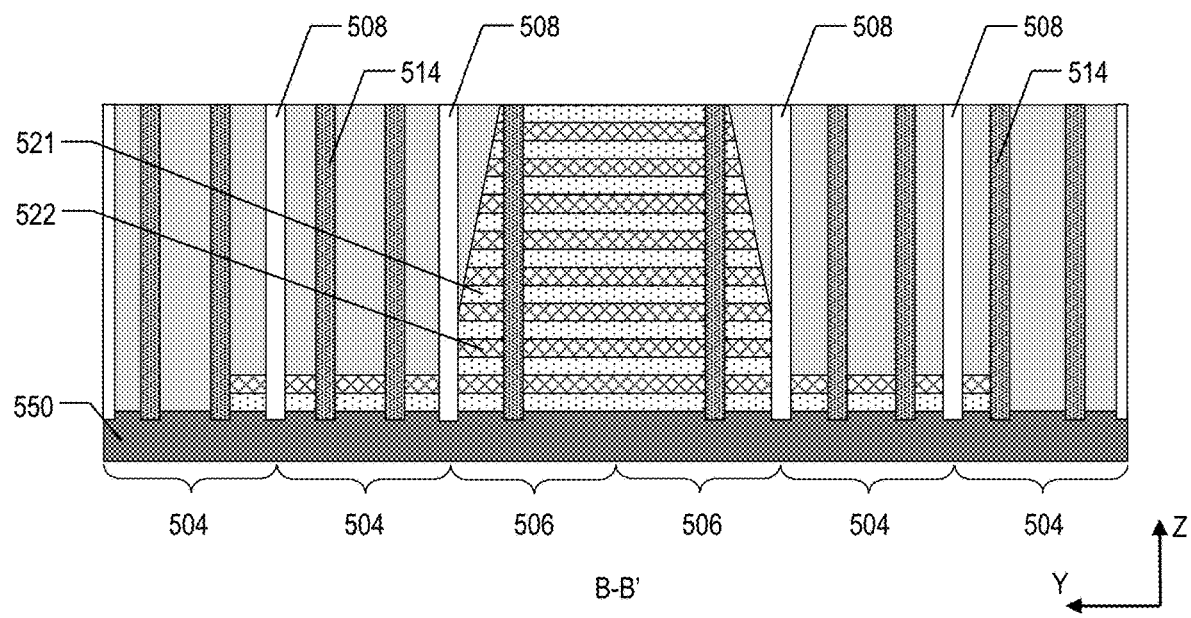

Further, returning to FIG. 15, a plurality of parallel gate line slits (GLSs) may be formed through the stack structure and at the boundaries of each finger and each wall-structure region of the plurality of blocks, and each GLS formed between adjacent blocks that have the wall-structure regions connected with each other may be discontinued in the staircase region by two first isolation structures (S603). FIGS. 11-12 illustrate schematic views of an exemplary semiconductor structure according to various embodiments of the present disclosure. Specifically, FIG. 11 illustrates a schematic plane view of the semiconductor structure, FIG. 12 illustrates a schematic cross-sectional view of the semiconductor structure shown in FIG. 11 along a B-B' direction.

Referring to FIGS. 11-12, a plurality of parallel GLSs 508 may be formed. For example, the plurality of GLSs 508 may include a plurality of first separation structures (not labeled) formed between adjacent blocks 502 that have the wall-structure regions 506 connected with each other. That is, some of the plurality of GLSs 508 (e.g., the plurality of first separation structures) may be formed at the boundary between adjacent blocks 502. Each GLS 508 (e.g., each first separation structure) formed between adjacent blocks 502 having the wall-structure regions 506 connected with each other may expose a side surface of the first isolation structure 516 on the same side of the staircase region 501. Therefore, the GLS 508 (e.g., the first separation structure) may be discontinued by two corresponding first isolation structures 516. That is, the GLS 508 may not be formed in the wall structure. Thus, the high-aspect etching process for forming the plurality of GLSs 508 may not affect the wall structure, and thus collapsing of the wall structure during the fabrication of the GLSs 508 may be prevented. As such, the performance of the memory device fabricated from the semiconductor structure may be improved.

It should be noted that only two blocks 502 are shown in the FIG. 11, a GLS 508 extending through both array regions 503 and the staircase region 501 along the X-direction may be formed on the side (e.g., edge) of each block 502 that is located opposite to the other block 502. For example, among the plurality of blocks 502, the two adjacent blocks 502 shown in FIG. 11 may be a first block and a second block, respectively. The first block may include a first side opposite to the second block and extending along the X-direction, and the second block may include a second side opposite to the first block and extending along the X-direction. According to the present disclosure, the plurality of GLSs 508 may include a second separation structure (not labeled) formed on the first side of the first block and through both array regions 503 and the staircase region 501, a second separation structure formed on the second side of the second block and through both array regions 503 and the staircase region 501, and a first separation structure formed in each array region 503 between the first block and the second block and connected to a corresponding first isolation structure 516.

In addition, within each block 502, the plurality of GLSs 508 may be used as separation structures. For example, the plurality of GLSs 508 may include a plurality of third separation structures (not labeled) for defining the fingers 504. In each array region 503, the plurality of third separation structures may include GLSs that are disposed between adjacent fingers 504 and between the wall-structure region 506 and an adjacent finger 504. In one embodiment, the GLSs 508 (e.g., the third separation structures) formed within each block 502 may provide a plurality of "H" cuts 510 formed at the junction region of the staircase region 501 and the array region 503, as shown in FIG. 11.

The plurality of GLSs 508 (including the first separation structures, the second separation structures, and third separation structures) may serve as a process basis for replacing the plurality of second dielectric layers 522 in the array regions 503 and the staircase structures during a subsequent process. In one embodiment, the width of the wall structure, which is the twice of the width of each wall-structure region 506, may be sufficiently large as compared to a width a single finger 502, such that after removing the second dielectric layers 522 in the array regions 503 and the staircase structures, a center portion of the second dielectric layers 522 may still remain in the wall structure, thereby providing necessary mechanical support for the fabrication process and electrical isolation for subsequently formed memory device. In one embodiment, the width of the wall-structure region 506 may be approximately the same as the width of each finger 504 in the Y-direction. As such, the width of the wall structure may be approximately twice of the width of each finger 504, which may ensure that a center portion of the second dielectric layers 522 may be retained in the wall structure after removing the second dielectric layers 522 in the array regions 503 and the staircase structures.

Figure 13:
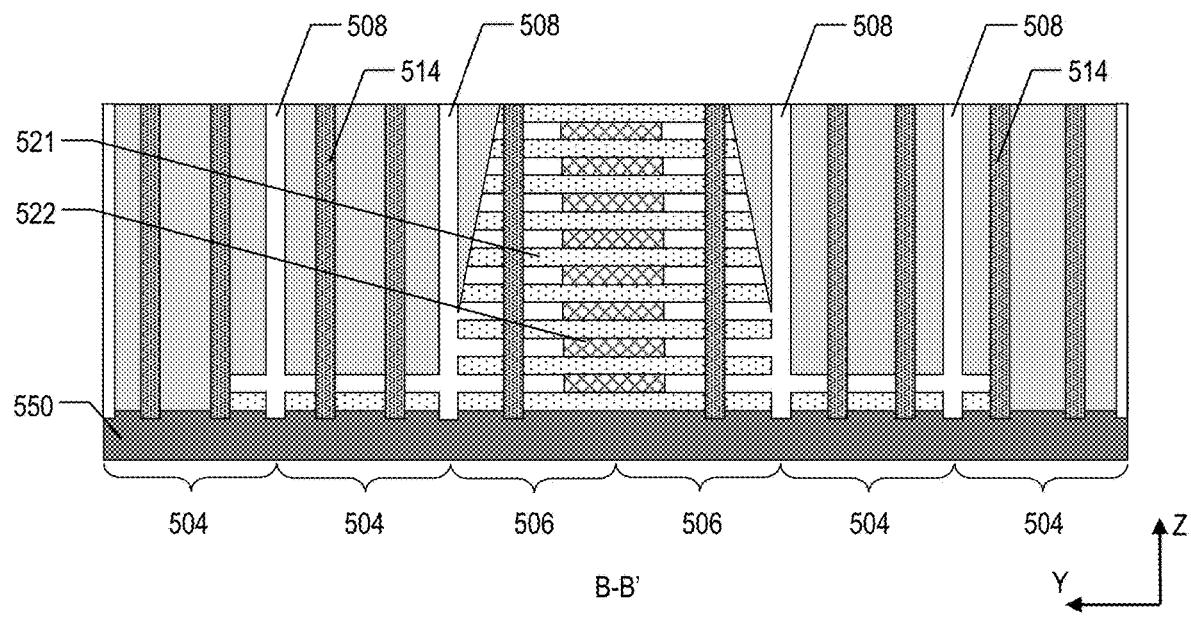

Further, returning to FIG. 15, the plurality second dielectric layers in the array regions and the staircase structures may be removed, and a portion of each second dielectric layer in the staircase region across adjacent blocks that have the wall-structure regions connected with each other may be retained after the removal (S604). FIG. 13 illustrates a schematic cross-sectional view of an exemplary semiconductor structure according to various embodiments of the present disclosure. Specifically, the cross-sectional view shown in FIG. 13 is developed from the cross-sectional view shown in FIG. 12. It should be noted that because the second dielectric layers are initially located between adjacent first dielectric layers, after removing the second dielectric layers, the plane view of the semiconductor structure remains the same as the plane view shown in FIG. 11. That is, FIG. 11 also provides a schematic plane view of the semiconductor structure after removing the second dielectric layers from the array regions and the staircase structures.

Referring to FIGS. 11 and 13, the plurality of second dielectric layers 522 formed in the two array regions 503 and the staircase structure of each block may be removed. In one embodiment, a wet etching process may be performed to remove the second dielectric layers 522, and the removal of the second dielectric layers 522 may start from the plurality of GLSs 508 (including the first separation structures, the second separation structures, and the third separation structures). During the etching process, the dummy channel structures 514, the channel structures 518, and the first isolation structures 516 may provide mechanical support. In addition, the longest distance from a point in the array region 503 or the staircase structure to the plurality of GLSs 508 may be smaller than the shortest distance from a point that is at the boundary between adjacent blocks 502 and in the wall structure to the plurality of GLSs 508. For example, as shown in FIG. 11, Point E represents a point on a line (not shown) connecting the two first isolation structures 516 in the X-direction, and Point F represents a point in the two array regions 503 or in the two staircase structures. It should be noted that Point E may be any point on the line connecting the two first isolation structures 516, and Point F may be any point in the two array regions 503 and the staircase structures of the plurality of blocks 502. Moreover, the distance from Point E to the closest GLS 508 is denoted as L1, and the distance from Point F to the closest GLS 508 is denoted as L2. According to the present disclosure, L1 may be always larger than L2. That is, the smallest value of L1 may be larger than the largest value of L2. When L1 is always larger than L2, by controlling the etching time, after the wet etching process removes all the second dielectric layers 522 (referring to FIG. 12) in the two array regions 503 or in the two staircase structures, a portion of each second dielectric layer 522 may still remain at the center of the wall structure in the Y-direction. FIG. 13 illustrates that a portion of each second dielectric layer 522 is retained after performing the wet etching process. As such, the remaining portion of the second dielectric layers 522 together with the plurality of first dielectric layers 521 may not only provide mechanical support for subsequent fabrication processes but also serve as part of the electric isolation between adjacent blocks 502 that have the wall-structure regions 506 connected with each other in the formed memory device. Because no GLS 508 is formed in the wall structure, collapsing of the wall structure may be avoided. Therefore, the performance of the formed memory device may be improved.

In one embodiment, after performing the wet etching process, a portion of the second dielectric layers 522 may still surround some dummy channel structures 514 formed in the wall structure. However, because the dummy channel structures 514 formed in the wall structure are merely used to provide mechanical support during the wet etching process, and are not used for making memory cells in subsequent processes, the remaining portion of the second dielectric layers 522 around some dummy channel structures 514 in the wall structure may not affect the performance of the formed memory device. When a sufficiently wide path for electrical connections through the wall structure is ensured by partially replacing each second dielectric layer 522 with an electrode layer, the remaining second dielectric layers 522 in the wall structure may be able to enforce the mechanical support for the wall structure.

Figure 14:
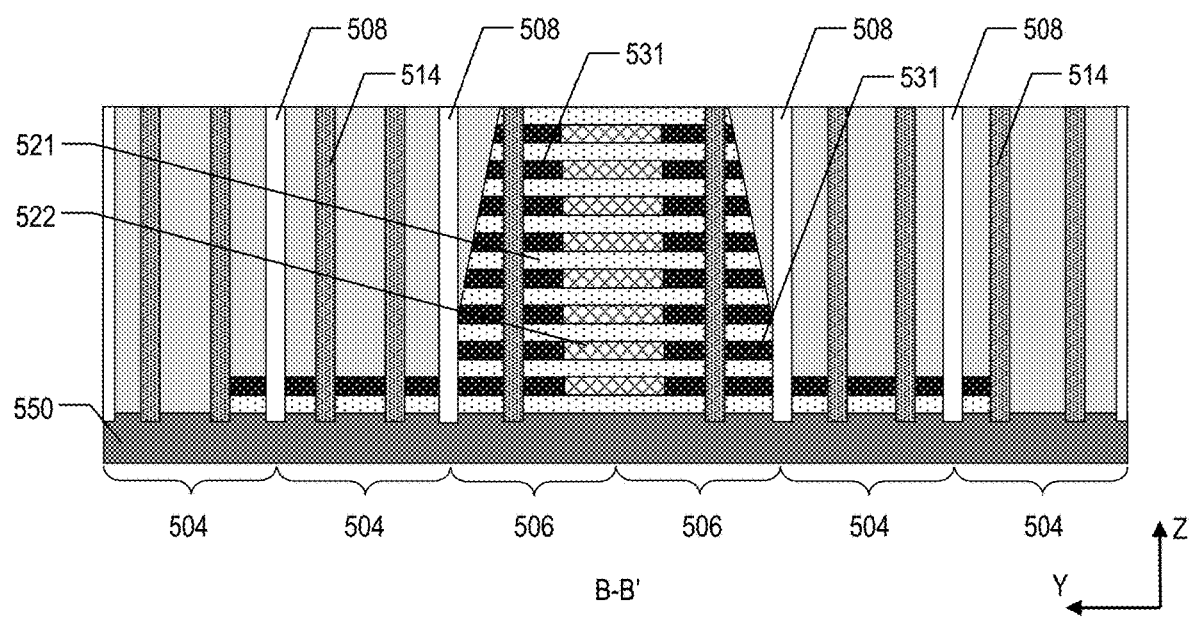

Further, returning to FIG. 15, a plurality of electrode layers may be formed in the empty spaces between adjacent first dielectric layers (S605). FIG. 14 illustrate a schematic cross-sectional view of an exemplary semiconductor structure according to various embodiments of the present disclosure. Specifically, the cross-sectional view shown in FIG. 14 is developed from the cross-sectional view shown in FIG. 13. It should be noted that because the electrode layers are formed between adjacent first dielectric layers, after forming the plurality of electrode layers, the plane view of the semiconductor structure remains the same as the plane view shown in FIG. 11. That is, FIG. 11 also provides a schematic plane view of the semiconductor structure after forming the plurality of electrode layers.

Referring to FIG. 14, a plurality of electrode layers 531 may be formed in the empty spaces between adjacent first dielectric layers 521. As such, the plurality of second dielectric layers 522 (referring to FIG. 12) formed in the array regions 503 (referring to FIG. 11) and the staircase structures may be replaced by the plurality of electrode layers 531.

In one embodiment, the plurality of electrode layers 531 may be made of a conductive material, e.g., tungsten. The plurality of electrode layers 531 may be formed using any fabrication process known to those skill in the art, and the present disclosure does not specifically define the process for forming the plurality of electrode layers 531.

Further, to form a memory device, the disclosed method may further include forming a plurality of word line contacts (not shown) in the staircase structure, and other fabrication processes for completing the formation of a memory device. Those skilled in the art should understand that any appropriate fabrication process for completing the formation of a memory device in existing technology may be adopted.

According to the disclosed fabrication process, a first isolation structure is formed in the peripheral region at the boundary between each array region and the wall structure. When fabricating a plurality of GLSs, there is no GLS formed in the wall structure, such that collapsing of the wall structure may be avoided. Further, because the width of the wall structure is large, when removing the second dielectric layers, a center portion of the second dielectric layers in the wall structure may not be removed. The remaining portion of the second dielectric layers and the original first dielectric layers in the wall structure may not only provide mechanical support for subsequent fabrication processes but also serve as part of the electric isolation between adjacent blocks in the formed memory device. Therefore, the performance of the formed memory device may be improved.

Figure 16:
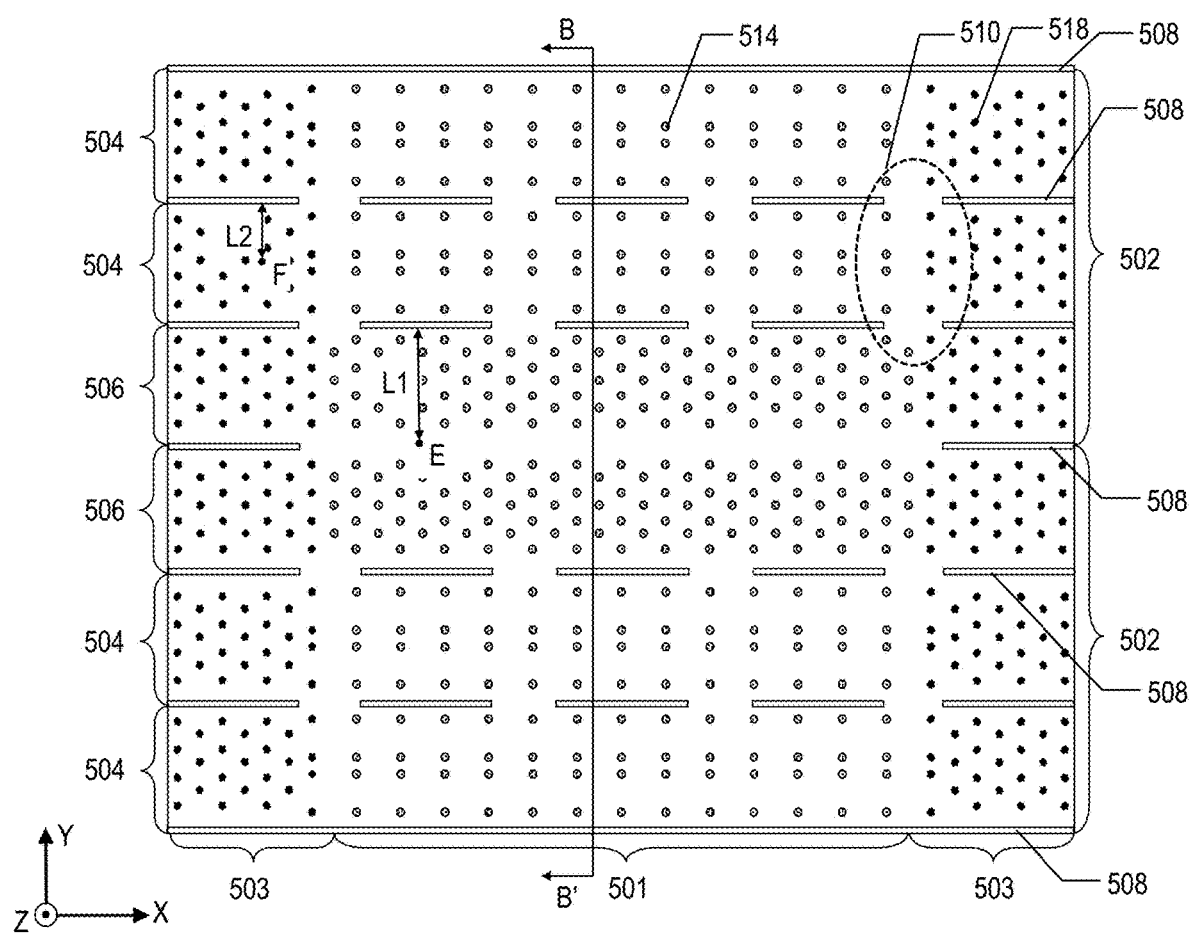
FIG. 16 illustrates a schematic top view of an exemplary semiconductor structure according to various embodiments of the present disclosure.

The present disclosure also provides another method for forming a memory device. FIG. 16 illustrates a schematic top view of a semiconductor structure fabricated by an exemplary method according to various embodiments of the present disclosure. Compared to the semiconductor structure formed by the method described in above embodiments, the method for forming the semiconductor structure shown in FIG. 16 may not include forming a first isolation structure on each side of the staircase region 501 between adjacent blocks 502 that have the wall-structure regions 506 connected with each other along the Y-direction. Instead, when forming the plurality of GLSs 508 after the plurality of dummy gate structures 514 and the staircase structure are formed, the GLS 508 (also referred to as the first separation structure) formed between adjacent blocks 502 that have the wall-structure regions 506 connected with each other may be located in the array regions 503. After further replacing the plurality of second dielectric layers with a plurality of electrode layers, because a plurality of electrode layers is inevitably formed at the boundary between the two blocks in the region close to the end of each first separation structure, the method may further include extending each first separation structure along the X-direction to completely remove the plurality of electrode layers formed at the boundary between the two blocks. As such, electrical isolation between the two adjacent blocks may be achieved. In one embodiment, the first separation structure (e.g., the GLS 508 formed between adjacent blocks 502 that have the wall-structure regions 506 connected with each other) may be extended by a dry etching process towards the staircase region 503, such that the plurality of electrode layers can be completely removed from the boundary between the two blocks 502.

Figure 17:
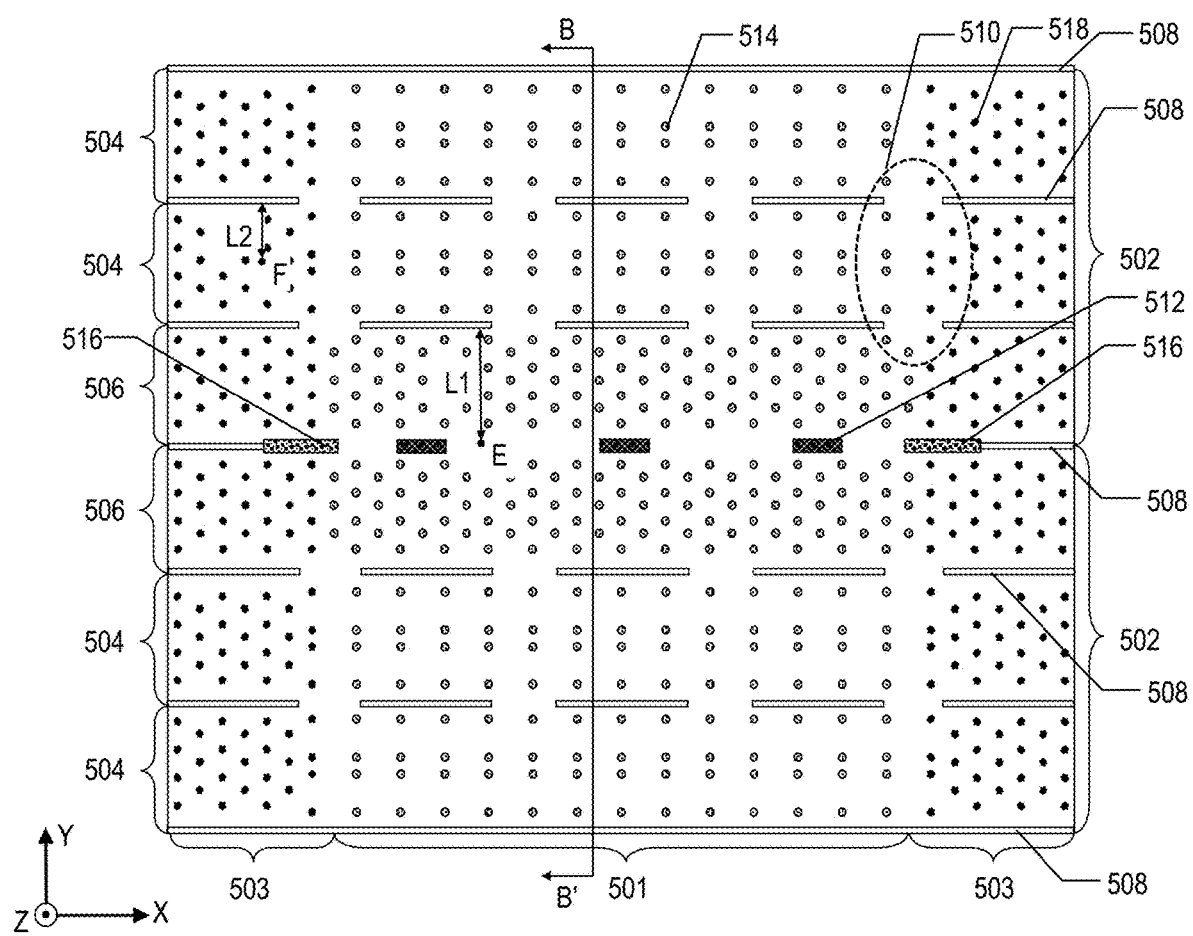
FIG. 17 illustrates a schematic top view of another exemplary semiconductor structure according to various embodiments of the present disclosure.

The present disclosure also provides another method for forming a semiconductor structure. FIG. 17 illustrates a schematic top view of a semiconductor structure fabricated by an exemplary method according to various embodiments of the present disclosure. Compared to the semiconductor structure formed by the method described in above embodiments, the method for forming the semiconductor structure shown in FIG. 17 may include forming a plurality of discrete second isolation structures 512 at the boundary between adjacent blocks 502 that have the wall-structure regions 506 connected with each other along the Y-direction. The plurality of second isolation structures 512 may be formed together with the first isolation structures 516 and thus may be made of a same material as the first isolation structures 516. For example, when forming the first isolation structure 516 on each side of the staircase region 501 and between the two adjacent blocks 502, the plurality of discrete second isolation structures 512 may be simultaneously formed in the staircase region 501 at the boundary between the two adjacent blocks 502. Further, after removing the plurality of second dielectric layers, a portion of the second dielectric layers 522 may remain in the staircase region 501. In the X-direction, the remaining portion of the second dielectric layers may connect adjacent second isolation structures 512 and also connect each first isolation structure 516 to a second isolation structure 512. As such, the GLS 508 (e.g., the first separation structure), the plurality of first isolation structures 516, the plurality of second isolation structure 512, and the remaining portion of the second dielectric layers may together provide electrical isolation for the two adjacent blocks 502.

The present disclosure also provides a memory device. FIGS. 11 and 14 illustrate schematic views of an exemplary memory device consistent with various embodiments of the present disclosure. Specifically, FIG. 11 illustrates a schematic plane view of the exemplary memory device, and FIG. 14 illustrates a schematic cross-sectional view of the memory device shown in FIG. 11 along a B-B' direction.

Referring to FIGS. 11 and 14, X, Y, and Z are used to illustrate the spatial relationship of the components in the memory device. The memory device may include a substrate 550 and a stack structure formed on the substrate 550. In a first lateral direction (the X-direction) with respect to the substrate 550, the memory device may include a staircase region 501 and two array regions 503 separated by the staircase region 501. In a second lateral direction (the Y-direction) with respect to the substrate 550, the memory device may be divided into a plurality of blocks 502. Further, in the Y-direction, each block 502 may include multiple fingers 504 together with a wall-structure region 506. The wall-structure region 506 may separate the multiple fingers 504 of the block 502 from an adjacent block 502. It should be noted that, for illustrative purposes, only a part of each array region 503 that is adjacent to the staircase region 501 is shown in FIG. 11.

The stack structure may include a plurality of first dielectric layers 521 and a plurality of electrode layers 531. The plurality of first dielectric layers 521 and the plurality of electrode layers 531 may be alternately stacked on the substrate 550. In one embodiment, the substrate 550 may be made of silicon, germanium, silicon germanium, or any other appropriate semiconductor material. In other embodiments, the substrate may be made of SOI, GOI, or any other appropriate semiconductor composite. In one embodiment, the plurality of first dielectric layers 521 may be made of an oxide, e.g., silicon oxide, and the plurality of electrode layers 531 may be made of a conductive material, e.g., tungsten.

In each block 502, the stack structure may include a plurality of stairs (e.g., a staircase structure) in the overlapped region between the multiple fingers 504 and the staircase region 501. In one embodiment, the plurality of stairs may include at least one stair exposing the lowest level of the electrode layer 531. The memory device may include a wall structure in the overlapped region between the staircase region 501 and two wall-structure regions 506, respectively of two adjacent blocks 502.

The memory device may include a plurality of dummy gate structures 514 formed in the staircase region 501 through the stack structure. Moreover, the memory device may further include a first isolation structure 516 formed through the stack structure on each side of the wall structure in the X-direction and between adjacent blocks 502.

In one embodiment, the first isolation structure 516 may have a rectangular shape. Moreover, the dimension of the first isolation structure 516 in the X-direction may be larger than a dimension of the first isolation structure 516 in the Y-direction. For example, the dimension of the first isolation structure 516 in the Y-direction may be in a range of approximately 10 nm to 40 nm. The dimension of the first isolation structure 516 in the X-direction may be larger than the half of the dimension of the wall-structure region 506 in the Y-direction. In other embodiments, the first isolation structure may have any other appropriate shape.

In one embodiment, a substantial portion of the first isolation structure 516 may be formed in the array region 503. For example, the entire first isolation structure 516 may be formed in the array region 503 with one side (e.g., edge) close to or overlapped with the boundary between the array region 503 and the staircase region 501, or the portion of the first isolation structure 516 formed in the array region 503 may be substantially larger than the portion of the first isolation structure 516 formed in the staircase region 501. In other embodiments, the portion of the first isolation structure formed in the array region may be equal to or smaller than the portion of the first isolation structure formed in the staircase region. It should be noted that the first isolation structure 516 may not be entirely formed in the staircase region 501; otherwise, a subsequently formed GLS (e.g., a first separation structure) at the boundary between adjacent blocks 502 may extend into the wall structure, increasing the risk of wall-structure collapsing.

In one embodiment, the first isolation structures 516 and the plurality of dummy channel structures 514 may be made of an insulating material. For example, the first isolation structures 516 and the plurality of dummy channel structures 514 may be made of silicon oxide.

In one embodiment, the memory device may further include a plurality of channel structures 518 formed in the two array regions 503 through the stack structure. Each channel structure 518 may include a blocking layer (not shown), a charge trapping layer (not shown), a tunneling layer (not shown), and a channel layer (not shown) along a direction toward the center of the channel structure 518. Further, the blocking layer may be made of silicon oxide, the charge trapping layer may be made of silicon nitride, the tunneling layer may be made of silicon oxide, and the channel layer may be made of polycrystalline silicon.

Further, the memory device may include a plurality of parallel GLSs 508. The plurality of GLSs 508 may include a plurality of first separation structure (not labeled) formed between adjacent blocks 502 that have the wall-structure regions 506 connected with each other. Each GLS 508 (e.g., each first separation structure) formed between adjacent blocks 502 that have the wall-structure regions 506 connected with each other may expose a side surface of the first isolation structure 516 formed on the same side of the staircase region 501. Therefore, the GLS 508 (e.g., each first separation structure) may be discontinued by two corresponding first isolation structures 516. That is, the GLS 508 (e.g., each first separation structure) may not be formed in the wall structure.

It should be noted that only two blocks 502 are shown in the FIG. 11, a GLS 508 extending through both array regions 503 and the staircase region 501 along the X-direction may be formed on the side (e.g., edge) of each block 502 that is located opposite to the other block 502. For example, among the plurality of blocks 502, the two adjacent blocks 502 shown in FIG. 11 may be a first block and a second block, respectively. The first block may include a first side opposite to the second block and extending along the X-direction, and the second block may include a second side opposite to the first block and extending along the X-direction. According to the present disclosure, the plurality of GLSs 508 may include a second separation structure (not labeled) formed on the first side of the first block and through both array regions 503 and the staircase region 501, a second separation structure formed on the second side of the second block and through both array regions 503 and the staircase region 501, and a first separation structure formed in each array region 503 between the first block and the second block and connected to a corresponding first isolation structure 516.

In addition, within each block 502, the plurality of GLSs 508 may include a plurality of third separation structures (not labeled). In each array region 503, the plurality of third separation structures may be disposed between adjacent fingers 504 and between the wall-structure region 506 and an adjacent finger 504. In one embodiment, the GLSs 508 (e.g., the third separation structures) formed within each block 502 may have a plurality of "H" cuts 510 in the staircase region 501.

Further, the longest distance from a point in the array region 503 or the staircase structure to the plurality of GLSs 508 may be smaller than the shortest distance from a point that is at the boundary between adjacent blocks 502 and in the wall structure to the plurality of GLSs 508. For example, as shown in FIG. 11, Point E represents a point on a line (not shown) connecting the two first isolation structures 516 in the X-direction, and Point F represents a point in the two array regions 503 or in the two staircase structures. It should be noted that Point E may be any point on the line connecting the two first isolation structures 516, and Point F may be any point in the two array regions 503 and the staircase structures of the plurality of blocks 502. Moreover, the distance from Point E to the closest GLS 508 is denoted as L1, and the distance from Point F to the closest GLS 508 is denoted as L2. According to the present disclosure, L1 may be always larger than L2. That is, the smallest value of L1 may be larger than the largest value of L2.

Referring to FIG. 14, in the wall structure, the memory device may include a plurality of second dielectric layers 522 disposed between adjacent first dielectric layers 521 in the direction (the Z-direction) perpendicular to the top surface of the substrate 550. The plurality of second dielectric layers 522 divides the plurality of electrode layers 531 at the boundary between the two adjacent blocks 502 (referring to FIG. 11). In one embodiment, the plurality of second dielectric layers 522 may be made of a nitride, e.g., silicon nitride. In addition, each second dielectric layer 522 may electrically separate an electrode layer 531 that is at the same level as the second dielectric layer. Therefore, the plurality of second dielectric layers 522 in the wall structure together with the first isolation structures 516 and the GLS 508 formed at the boundary between the two adjacent blocks 502 may electrically isolate the plurality of electrode layers 531 in one block 502 from the plurality of electrode layers 531 in the other block 502.

It should be noted that a distance from a point in the plurality of electrode layers 531 to a closest GLS 508 may be always smaller than a distance from a point in the plurality of second dielectric layers 522 in the wall structure to a closest GLS 508.

In one embodiment, the memory device may further include a plurality of word line contacts (not shown) formed in the staircase structure to electrically connect the plurality of stairs.

According to the disclosed memory device, a first isolation structure is formed in the peripheral region at the boundary between each array region and the wall structure. Further, no GLS is required to be formed in the wall structure of the memory device, which may be conducive to preventing the wall structure from collapsing. Moreover, a plurality of second dielectric layers exists in the center of the wall structure. The plurality of second dielectric layers together with the plurality of first dielectric layers may not only provide mechanical support for the wall structure but also serve as part of the electric isolation between adjacent blocks in a memory device that is subsequently formed from the memory device. Therefore, the performance of the formed memory device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A memory device, comprising:
    a staircase region and an array region, along a first lateral direction;
    a wall structure in the staircase region; and
    a first separation structure in the array region and arranged along the first lateral direction with the wall structure, wherein:
        the wall structure comprises dielectric pairs of a first dielectric layer and a second dielectric layer stacked in the staircase region, and
        the first separation structure is vertically through a stack structure in the array region, the stack structure comprising pairs of the first dielectric layer and an electrode layer.

2. The memory device according to claim 1, further comprising:
    a first isolation structure is between the first separation structure in the array region and the wall structure in the staircase region.

3. The memory device according to claim 2, further comprising:
    one or more second isolation structures interspersed in the wall structure in the staircase region, wherein the one or more second isolation structures, the wall structure, and the first isolation structure are interconnected with each other in the first lateral direction.

4. The memory device according to claim 3, wherein:
    the first isolation structure and the one or more second isolation structures are made of an insulating material.

5. The memory device according to claim 2, wherein:
    a dimension of the first isolation structure in the first lateral direction is larger than a quarter of a dimension of the wall structure in the second lateral direction; and
    a dimension of the first isolation structure in the second lateral direction is in a range of approximately 10 nm to 40 nm.

6. The memory device according to claim 1, wherein:
    the first separation structure comprises a gate line slit structure.

7. The memory device according to claim 1, further comprising:
    an additional array region, wherein the staircase region is between the array region and the additional array region along the first lateral direction and the stack structure is further in the additional array region, an additional first separation structure vertically through the stack structure in the additional array region, and a first isolation structure between the additional first separation structure and the wall structure along the first lateral direction.

8. The memory device according to claim 1, further comprising:
staircase structures in the staircase region, wherein the wall structure is between adjacent staircase structures along a second lateral direction.

9. The memory device according to claim 8, further comprising:
dummy channel structures in the staircase region, wherein:
the dummy channel structures are vertically through the wall structure and/or through the staircase structures, and
the dummy channel structures are made of an insulating material.

10. The memory device according to claim 1, wherein:
the wall structure and the first separation structure together are between adjacent blocks or adjacent fingers of the memory device along a second lateral direction.

11. The memory device according to claim 1, further comprising:
a second separation structure in the staircase region and the array region, and extending along the first lateral direction, wherein the second separation structure is spaced apart from the first separation structure along a second lateral direction.

12. The memory device according to claim 1, further comprising:
word line contacts connected to stairs of each of the staircase structures.

13. The memory device according to claim 1, wherein:
the first dielectric layer is made of a material comprising silicon oxide;
the second dielectric layer is made of a material comprising silicon nitride; and
the electrode layer is made of a material comprising tungsten.

14. A method for forming a memory device, comprising:
forming dielectric pairs of a first dielectric layer and a second dielectric layer stacked in a staircase region and an array region of the memory device, wherein the staircase region and the array region are arranged along a first lateral direction;
forming a first separation structure in the array region, wherein the first separation structure is vertically through the dielectric pairs and extends along the first lateral direction; and
removing a portion of the second dielectric layer from the array region and partially from the staircase region, thereby forming a wall structure in the staircase region, wherein the wall structure comprises a remaining portion of the second dielectric layer and the first dielectric layer stacked over one another.

15. The method according to claim 14, further comprising:
forming an electrode layer between adjacent first dielectric layers after the portion of the second dielectric layer is removed, leaving a stack structure comprising pairs of the electrode layer and the first dielectric layer, wherein the first separation structure is vertically through the stack structure in the array region.

16. The method according to claim 14, prior to forming the first separation structure, further comprising:
forming a first isolation structure vertically through the dielectric pairs, such that after removing the portion of the second dielectric layer, the remaining portion of the second dielectric layer in the staircase region is connected to the first isolation structure.

17. The method according to claim 16, further comprising:
forming one or more second isolation structures in the staircase region when forming the first isolation structure, wherein:
the one or more second isolation structures and the first isolation structure are arranged along the first lateral direction,
the first isolation structure and the one or more second isolation structures are made of an insulating material; and
after removing the second dielectric layer, the remaining portion of the second dielectric layer in the staircase region is connected to an adjacent second isolation structure.

18. The method according to claim 14, wherein the memory device further comprises an additional array region, and the staircase region is between the array region and the additional array region along the first lateral direction, the method further comprising:
forming an additional first separation structure vertically through the dielectric pairs in the additional array region and extends along the first lateral direction, when forming the first separation structure, and
prior to forming the first separation structure, forming a first isolation structure vertically through the dielectric pairs, such that after removing the second dielectric layer, the remaining portion of the second dielectric layer in the staircase region is connected to the first isolation structure in the additional array region.

19. The method according to claim 14, further comprising:
forming dummy channel structures in the staircase region through the dielectric pairs prior to removing the portion of the second dielectric layer, wherein the dummy channel structures are made of an insulating layer.

20. The method according to claim 14, further comprising:
forming a second separation structure in the staircase region and the array region, and extending along the first lateral direction, wherein the second separation structure is spaced apart from the first separation structure along a second lateral direction.

* * * * *